(12) United States Patent
Hayakawa

(10) Patent No.: US 6,888,165 B2
(45) Date of Patent: May 3, 2005

(54) LIGHT-EMITTING DIODE

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 124 days.

(21) Appl. No.: 09/984,388

(22) Filed: Oct. 30, 2001

(65) Prior Publication Data
US 2002/0050600 A1 May 2, 2002

(30) Foreign Application Priority Data
Oct. 31, 2000 (JP) .............................. 2000/332679

(51) Int. Cl.$^7$ .............................................. H01L 27/15
(52) U.S. Cl. ........................... 257/79; 257/84; 257/94; 257/98; 257/103
(58) Field of Search .............................. 257/79, 84, 94, 257/98, 103

(56) References Cited

U.S. PATENT DOCUMENTS

| 5,537,433 | A | * | 7/1996 | Watanabe | 372/45 |
| 5,727,008 | A | * | 3/1998 | Koga | 372/43 |
| 6,285,696 | B1 | * | 9/2001 | Bour et al. | 372/45 |
| 6,323,052 | B1 | * | 11/2001 | Horie et al. | 438/46 |

FOREIGN PATENT DOCUMENTS

JP         11-074559       3/1999

OTHER PUBLICATIONS

H. Kressel, "Semiconductor Device for Optical Communication" $2_{nd}$ Edition, 1980, vol. 39, pp. 14.*

* cited by examiner

Primary Examiner—Hoai Pham
Assistant Examiner—Wai-Sing Louie
(74) Attorney, Agent, or Firm—Sughrue Mion, PLLC

(57) ABSTRACT

An n-GaN low-temperature buffer layer, an n-GaN buffer layer, an n-$In_{0.05}Ga_{0.95}N$ buffer layer, an n-$Al_{0.15}Ga_{0.85}N$ clad layer, an n-GaN optical guide layer, an undoped active layer, a p-GaN optical guide layer, a p-$Al_{0.15}Ga_{0.85}N$ clad layer, and a p-GaN cap layer, are grown on a sapphire substrate. Then, an epitaxial layer other than a light-emitting region is etched until the n-GaN buffer layer is exposed. Next, in a similar process, etching is performed up to anywhere within the p-$Al_{0.15}Ga_{0.85}N$ clad layer so that a 4-$\mu$m-wide stripe region in the form of a ridge remains. The length from the light-emitting facet to the opposite facet is between 30 and 250 $\mu$m.

19 Claims, 5 Drawing Sheets

F I G. 1
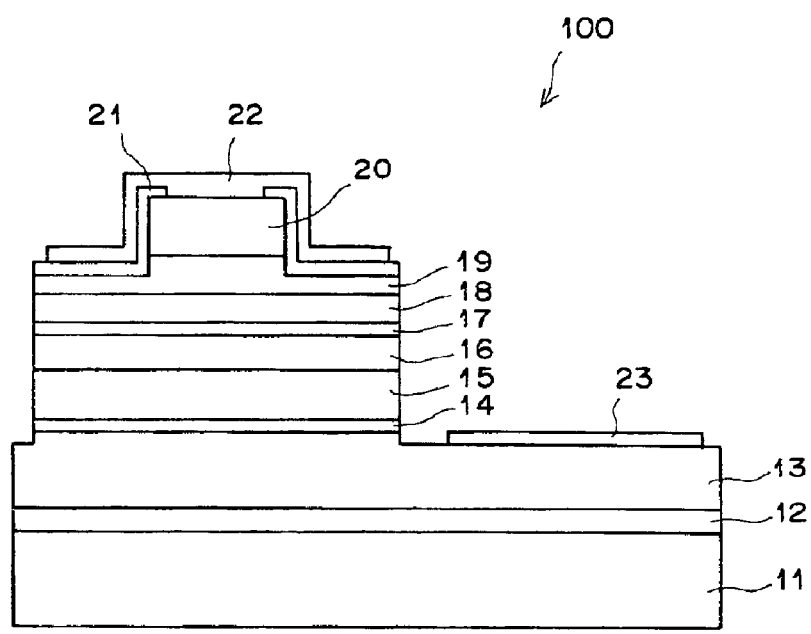

F I G . 2
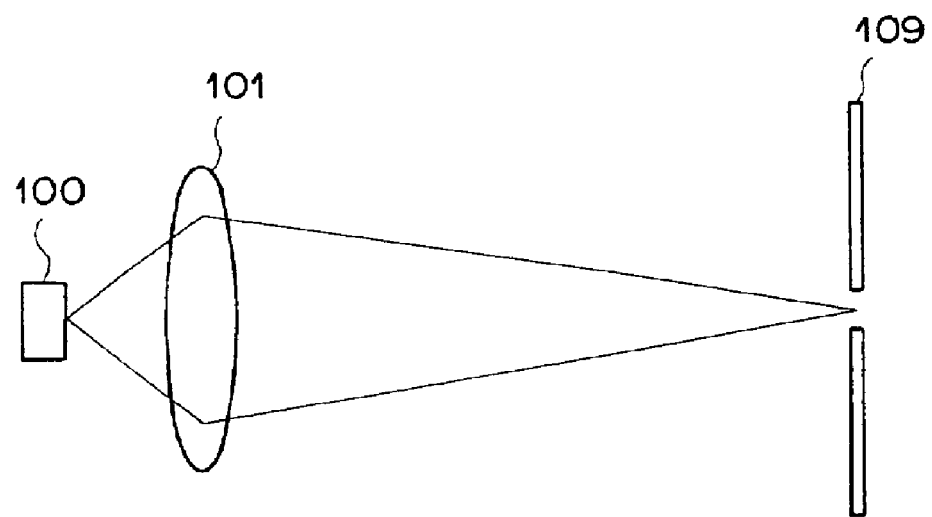

F I G . 3
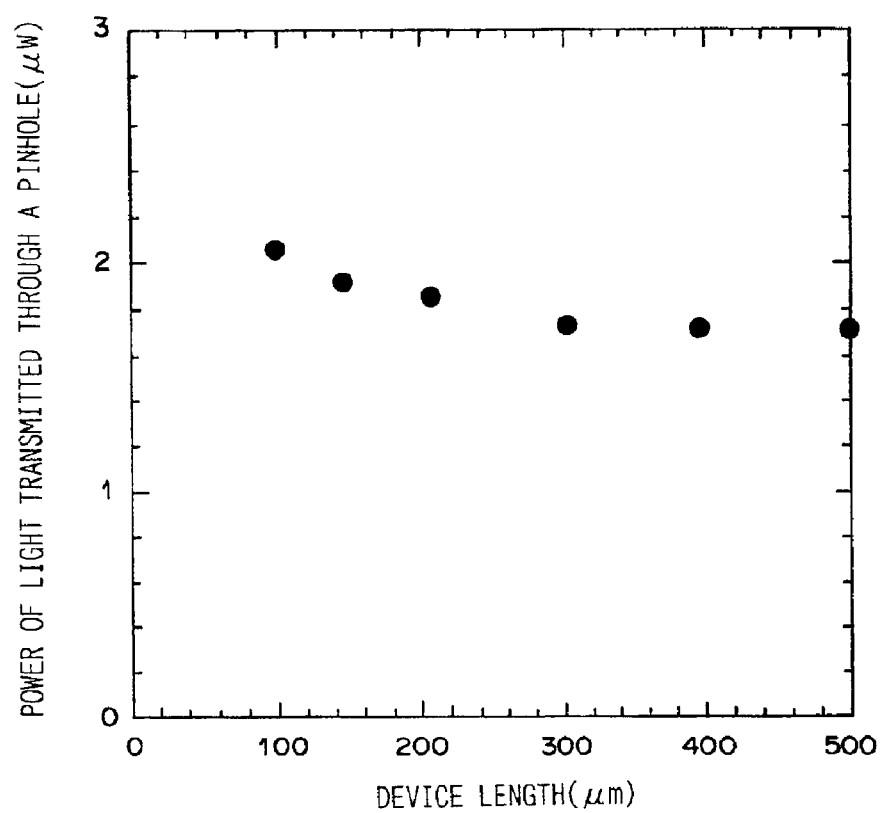

LIGHT-EMITTING DIODE

BACKGROUND OF THE INVENTION

1. Field of the Invention

The present invention relates to light-emitting diodes (LEDs) having a stripe waveguide structure.

2. Description of the Related Art

As a conventional printing system for a high definition photograph, a digital printer ("Frontier") equipped with an exposure system has been produced by the present applicant. The exposure system is used to expose a regular photosensitive material by employing a semiconductor laser as a red light source and also employing solid-state excitation lasers (utilizing second harmonic generation (SHG)) as blue and green light sources. In addition, there has been produced a relatively inexpensive exposure system ("Pictography") for exposing a photosensitive material that generates the colors to cyan, magenta, and yellow, by the use of a semiconductor laser light with two infrared wavelengths and a red wavelength. These exposure systems can perform high-speed light-beam scanning by employing a polygon mirror, etc., because they employ laser light sources. Therefore, they are able to perform printing at high speeds. In addition, it is not necessary for these exposure systems to have a high-speed paper feeder, such as a drum, etc., for scanning; they are capable of utilizing easier paper feed methods, such as those which supply continuous paper.

The former is able to employ regular color paper, which conforms with the sensitivity of the three primary colors, has the most stable characteristics and is of low cost. However, the former is able to use a semiconductor laser for red, but semiconductor lasers for green and blue have not been put to practical use. Because of this, small and high-definition laser light can be provided at relatively low cost by employing a gas laser or solid-state excitation laser (utilizing SHG) as a light source. In addition, since the electro-optic conversion at the initial stage is made by a semiconductor laser, the reliability is enhanced.

The latter, on the other hand, can employ commercially-available semiconductors (e.g., laser emission wavelengths 810 nm, 750 nm, and 680 nm), but it is necessary to employ a special photosensitive material that conforms with these wavelengths. As a result, the latter cannot be widely used for various purposes, and the printing cost increases. In addition, to conform with commercially-available semiconductors, the sensitivity is more shifted to the side of long wavelengths than is usual. Because of this, the durability is generally reduced compared with photosensitive materials for shorter wavelengths, and consequently, special care must be taken in handling. In addition, in such a method, the printer can be more inexpensively manufactured than the case of employing the above-mentioned solid-state laser, but it is necessary to prepare a special photosensitive material that conforms with the emission wavelengths of a semiconductor laser. Because of this, the material cost becomes high and consequently the running cost and the printing cost will be increased.

Therefore, to achieve further cost reduction in these devices, it is extremely important to reduce the cost of the laser light source which is the key device. The cost of red semiconductor lasers are being reduced for their use as a light source for a high-density magneto-optic disk or digital video disk (DVD). However, for blue and green, it is difficult to obtain semiconductor lasers, and in the solid-state lasers currently in use, cost reduction like a semiconductor laser is difficult due to the number of components and the assembly cost.

In addition, as the light source of a conventional digital printer for a silver-chloride photograph, it is ideal to employ a laser light source that emits light in red, green, and blue bands. In the case a material whose sensitivity is high like a general-purpose silver chloride sensitive material is employed, the light intensity on the sensitive material may be a low light output on the order of 1 $\mu$W. Therefore, instead of an expensive semiconductor laser, a light source for a printer may be an LED having the advantages of laser light that the spot size (beam diameter) is small and that the radiation angle of the light beam is narrow.

At present, high-brightness blue and green LEDs have been realized with an InGaN-system material (see "The Blue Laser Diode," S. Nakamura and G. Fasol, Springer, Berlin, 1997). These LEDs, as with other LEDs for red, etc., have a light-emitting surface of a few hundred $\mu$m$^2$, and the light is divergent light. Therefore, to constitute a high-definition printer, if the LEDs are employed as light sources to form a spot of a few ten $\mu$m in diameter, there is a problem that the light quantity of divergent light which is coupled into the finite aperture of an optical system will become extremely small, and that since an image is formed by a reduction optic system of about ½ to ⅒, the lens is moved away from the light source and therefore the coupling efficiency will be further reduced.

To solve the above-mentioned problem, a semiconductor light-emitting element with an optical waveguide structure having a micro light-emitting region, and an exposure apparatus, have been proposed in Japanese Unexamined Patent Publication No. 11(1999)-074559 by the present inventor. In the semiconductor light-emitting element with a stripe structure disclosed in the above-mentioned publication, it has been found that in a region of complete spontaneous emission light having no stimulated emission, the light beam can be collected to a microspot.

An LED with such a stripe waveguide region has hitherto been fabricated with the same design as that of a semiconductor laser. However, it has become apparent that in an LED, that does not employ a resonator, it is not optimal to utilize the same design as that of a semiconductor laser. Particularly, in semiconductor lasers, the reflectance factor at the resonator end plane and the resonance length are important design factors, because they can be the main cause of the efficiency loss of the resonator. On the other hand, the LED, which has practically no stimulated emission or no stimulated emission at all, is quite different in design from the semiconductor laser, because it does not operate as a resonator, even if it has a similar stripe structure. Furthermore, since spontaneous emission light is not high in wave-guiding efficiency, the light emitted from the rear end portion of the stripe waveguide region is absorbed in the active layer and therefore it is not effectively emitted from the front facet.

SUMMARY OF THE INVENTION

The present invention has been made in view of the aforementioned circumstances. Accordingly, it is the primary object of the present invention to provide an LED with a stripe waveguide structure that is capable of realizing high output and increasing the quantity of light which can be collected to a microspot, by guiding light more effectively.

To achieve this end, there is provided a light-emitting diode with a stripe waveguide structure, comprising:

an active layer comprising at least one of InGaN, GaN, and AlGaN;

wherein a length from a light-emitting facet to a facet opposite to the light-emitting facet is between 30 and 250 $\mu$m.

It is desirable that the opposite facet have a high reflective coating. It is also desirable that the high reflective coating have a reflectance factor which is 50% or greater with respect to light having a wavelength as that of the emitted light.

According to the LED of the present invention, the length from the light-emitting facet to the opposite facet is between 30 and 250 $\mu$m. Therefore, a region useless for light guiding is removed and only an effective region is left behind. As a result, the light-guiding efficiency can be enhanced and high output can be obtained. Thus, power of the light collected at a microspot can be increased. A device length of 30 $\mu$m is the limit in the device fabrication presently considerable.

Since the device length is 300 $\mu$m or greater, the number of devices that are obtained from the same wafer can be increased by 1.5 times or greater. For this reason, the fabrication cost can be considerably reduced.

In addition, in the case where the length of the LED corresponds to an effective waveguide length, and the facet opposite to the light-emitting facet is provided with a high reflective coating, emitted light near the opposite facet can be effectively guided to the front facet, so that higher output can be obtained.

BRIEF DESCRIPTION OF THE DRAWINGS

The present invention will be described in further detail with reference to the accompanying drawings wherein:

FIG. 1 is a sectional view of an LED according to a first embodiment of the present invention;

FIG. 2 is a schematic diagram of a light-collecting system employing the LED of the first embodiment of the present invention;

FIG. 3 is a graph showing the relationship between the length of the LED and the power to collect light to a pinhole;

DESCRIPTION OF THE PREFERRED EMBODIMENTS

Figure 4:
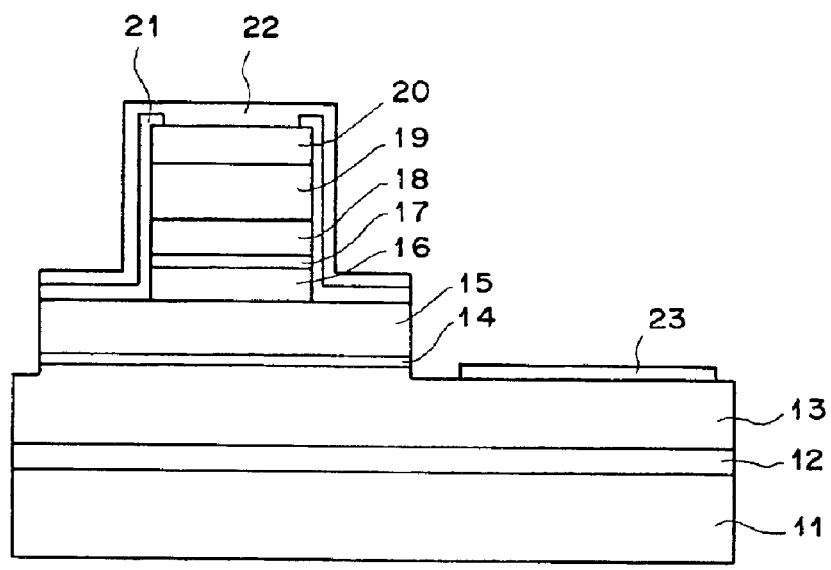
FIG. 4 is a sectional view of an LED according to a second embodiment of the present invention.

An InGaN blue LED according to a first embodiment of the present invention will hereinafter be described with reference to FIG. 1, along with the fabrication process thereof.

As shown in FIG. 1, an n-GaN low-temperature buffer layer 12, an n-GaN buffer layer 13 (doped with Si and of a thickness of 5 $\mu$m), an n-In$_{0.05}$Ga$_{0.95}$N buffer layer 14 (doped with Si and of a thickness of 0.1 $\mu$m), an n-Al$_{0.15}$Ga$_{0.85}$N clad layer 15 (doped with Si and a thickness of 0.4 $\mu$m), an n-GaN optical guide layer 16 (doped with Si and of a thickness of 0.12 $\mu$m), an undoped active layer 17, a p-GaN optical guide layer 18 (doped with Mg and of a thickness of 0.12 $\mu$m), a p-Al$_{0.15}$Ga$_{0.85}$N clad layer 19 (doped with Mg and of a thickness of 0.4 $\mu$m), and a p-GaN cap layer 20 (doped with Mg and of a thickness of 0.3 $\mu$m), are grown epitaxially upon a sapphire C-plane substrate 11 by metalorganic chemical-vapor deposition (MOCVD). Thereafter, a p-type impurity is activated in an ambient atmosphere of nitrogen gas by heat treatment.

The active layer 17 has a double quantum well structure, which consists of an undoped In$_{0.05}$Ga$_{0.95}$N (thickness 10 nm), an undoped In$_{0.28}$Ga$_{0.72}$N quantum cell layer (thickness 3 nm), an undoped In$_{0.05}$Ga$_{0.95}$N (thickness 5 nm), an undoped In$_{0.28}$Ga$_{0.72}$N quantum well layer (thickness 3 nm), an undoped In$_{0.05}$Ga$_{0.95}$N (thickness 10 nm), and an undoped Al$_{0.1}$Ga$_{0.9}$N (thickness 10 nm).

Next, an unnecessary portions other than a light-emitting region is removed by photolithography and etching. Thereafter, the epitaxial layer other than the light-emitting region is removed by reactive ion beam etching (RIBE), which employs a chlorine ion, until the n-GaN buffer layer 13 is exposed. In this way the light-emitting facet (front facet) of the LED of this embodiment is formed. In a similar process, etching is performed up to anywhere in the p-Al$_{0.15}$Ga$_{0.85}$N clad layer 19 so that a 4-$\mu$m-wide stripe region in the form of a ridge remains. After a SiN film 21 is formed on the entire surface by plasma-assisted chemical vapor deposition (PCVD), a 4-$\mu$m-wide stripe window and an n-type electrode forming region, for current injection, are formed in the SiN film 21 by etching. Thereafter, for an n-type electrode 23, Ti/Al/Ti/Au is deposited to form an ohmic electrode and is annealed in a nitrogen atmosphere to remove damage to device characteristics. Similarly, for a p-type electrode 22, Ni/Au is deposited to form an ohmic electrode and is annealed in a nitrogen atmosphere. In this manner, an LED 100 is fabricated as shown in FIG. 1.

The LED 100 according to the first embodiment has a stripe structure for end-plane light emission and emits light at a blue band of 470 nm. The chip is 300 $\mu$m in width and 200 $\mu$m in length. The light-emitting facet on one side (front side) of the chip has a low reflective coating of 2%. The LED 100, fabricated under the above-mentioned conditions, emits micro-light having a spot size of approximately 4 ($\mu$m)×1 ($\mu$m). This size is extremely small compared with commonly used LEDS, so the LED of the first embodiment has sufficient characteristics to be used as a light source for a printer.

The LED 100 of the first embodiment and a conventional LED were evaluated with respect to ability to collect light to a microspot by employing an optical system, shown in FIG. 2. In the method of evaluation, light emitted from the end-plane LED 100 of the first embodiment described above was collected to a pinhole 109 of 10 $\mu$m in diameter by a lens 101 (with a numerical aperture (NA) of 0.5, 20 magnifications, and a focal distance of 3.2 mm), and the power of the light transmitted through the pinhole 109 was compared with the total emission power from the front facet of the LED 100. In the LED 100 of the first embodiment, when the drive current was 26 mA and the total emission power was 70 $\mu$W, the power of the light transmitted through the pinhole 109 was 1.8 $\mu$W.

Next, for LEDs which are the same in structure as the first embodiment but different in device length, the power of the light transmitted through pinhole 109 was evaluated with the same drive current. The optical powers at various device lengths were obtained as shown in FIG. 3.

At device lengths less than 200 $\mu$m, satisfactory light-collecting power has been obtained, because the device lengths coincide with a device length effective for both a rise in current density and the light emission from the front facet.

If the rear facet of the LED is provided with a high reflective coating of 80%, the light output from the front facet is further increased by 10% or greater. At a device length of 500 $\mu$m, a rise in the light output from the front facet is slight even if a high reflective coating is provided on the rear facet. From this, it follows that by shortening the device length, emitted light near the rear facet is guided to the front facet.

Next, an InGaN blue LED according to a second embodiment of the present invention will be described with reference to FIG. 4, along with the fabrication process.

The LED of the second embodiment is the same in basic layer structure and fabrication method as the first embodiment. Therefore, the same reference numerals will be applied to the same parts as the first embodiment to avoid redundancy.

In the LED with a stripe width of 4 μm according to the second embodiment, the thicknesses of an n-GaN guide layer 16 and a p-GaN optical guide layer 18 are both set thicker (1.5 μm). In addition, the ridge process is performed so that a portion of the n-GaN guide layer 16 other than the stripe portion is removed. If the entire optical guide layer is thus formed into a stripe shape, spontaneous emission light is effectively guided to the front facet of the LED and therefore the light-collecting efficiency is enhanced.

Next, an InGaN blue LED according to a third embodiment of the present invention will be described with reference to FIG. 5, along with the fabrication process. The basic structure and fabrication method of the third embodiment is the same as the first embodiment except that a 6H—Si substrate 31 with n-type conductivity is employed as the substrate. Therefore, the same reference numerals will be applied to the same parts as the first embodiment to avoid redundancy.

Figure 5:
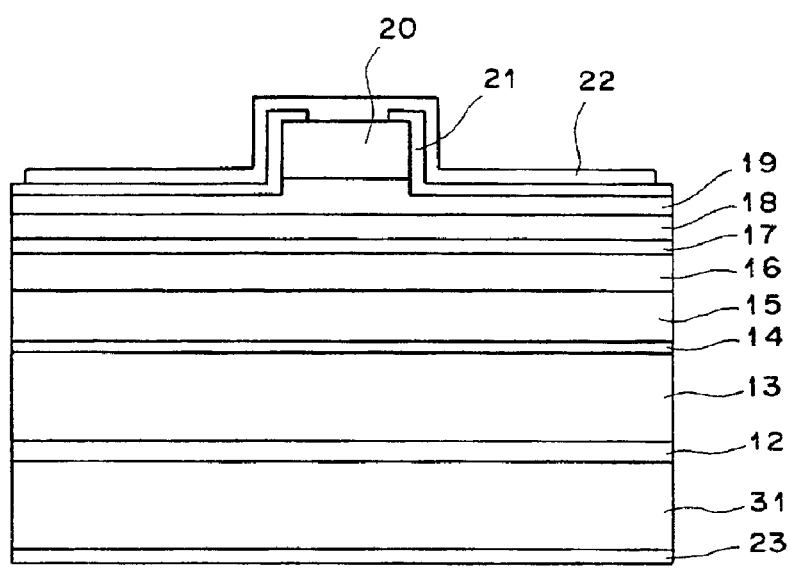
FIG. 5 is a sectional view of an LED according to a third embodiment of the present invention.

As shown in FIG. 5, in the LED of the third embodiment, the 6H—Si substrate 31 with n-type conductivity is employed as the substrate. For this reason, an n-type electrode 23 is formed on the bottom surface of the 6H—Si substrate 31.

In the three embodiments described above, the LEDs have light emission wavelengths in a blue region. However, the present invention is also applicable to LEDs having light emission wavelengths in a region of green (492 nm or greater), a region of violet (450 nm or less), or an ultraviolet region of further shorter wavelengths. For ultraviolet, for instance, the present invention is also applicable to an LED which has a GaN or AlGaN active layer, an AlGaN optical guide layer, and an AlGaN clad layer. An AlGaN/GaN superlattice, etc., can be employed as the clad layer.

Furthermore, in the aforementioned embodiments, the ridge-shaped stripe structure with an insulating film has been described as the device structure. However, the present invention is also applicable to various structures, which have hitherto been adapted in the stripe geometry semiconductor lasers, such as a recessed type structure (e.g., AlGaN). Finally, the LED according to the present invention is applicable to high-speed and high-definition printers, because the optical power at the microspot has been increased.

What is claimed is:

1. A light-emitting diode with a stripe waveguide structure, comprising:

an active layer comprising at least one of InGaN, GaN, and AlGaN;

wherein a length from a light-emitting facet to a facet opposite to said light-emitting facet is between 30 and 250 μm.

2. The light-emitting diode as set forth in claim 1, wherein said opposite facet has a high reflective coating.

3. The light-emitting diode as set forth in claim 2, wherein said high reflective coating has a reflectance factor which is 50% or greater with respect to light having a wavelength as that of the light emitted by said diode.

4. The light-emitting diode as set forth in claim 1, wherein a majority of emitted light is generated by spontaneous emission, rather than stimulated emission.

5. The light-emitting diode as set forth in claim 1, wherein the light-emitting diode has no stimulated emission when emitting light.

6. The light-emitting diode as set forth in claim 2, wherein a majority of emitted light is generated by spontaneous emission, rather than stimulated emission.

7. The light-emitting diode as set forth in claim 2, wherein the light-emitting diode has no stimulated emission when emitting light.

8. The light-emitting diode as set forth in claim 3, wherein a majority of emitted light is generated by spontaneous emission, rather than stimulated emission.

9. The light-emitting diode as set forth in claim 3, wherein the light-emitting diode has no stimulated emission when emitting light.

10. A light-emitting diode comprising:

a stripe waveguide having an active layer, said active layer comprising at least one of InGaN, GaN, and AlGaN;

wherein a length of the stripe waveguide from a light-emitting facet to a facet opposite to said light-emitting facet is between 30 and 250 μm, and wherein said length from the light-emitting facet to the facet opposite to said light emitting facet is not a resonance length for the light emitted by said light-emitting diode.

11. The light-emitting diode as set forth in claim 1, wherein the light-emitting diode does not operate as a resonator.

12. A light-emitting diode comprising:

a stripe waveguide having an active layer, said active layer comprising at least one of InGaN, GaN, and AlGaN;

wherein a length of the stripe waveguide from a light-emitting facet to a facet opposite to said light-emitting facet is between 30 and 250 μm, and wherein the light-emitting diode does not employ a resonator.

13. The light-emitting diode as set forth in claim 1, wherein the length from the light-emitting facet to the facet opposite to said light-emitting facet is between 30 and 200 μm.

14. The light-emitting diode as set forth in claim 10, wherein said opposite facet has a high reflective coating.

15. The light-emitting diode as set forth in claim 14, wherein said high reflective coating has a reflectance factor which is 50% or greater with respect to light having a wavelength as that of the light emitted by said diode.

16. The light-emitting diode as set forth in claim 10, wherein the length from the light-emitting facet to the facet opposite to said light-emitting facet is between 30 and 200 μm.

17. The light-emitting diode as set forth in claim 12, wherein said opposite facet has a high reflective coating.

18. The light-emitting diode as set forth in claim 17, wherein said high reflective coating has a reflectance factor which is 50% or greater with respect to light having a wavelength as that of the light emitted by said diode.

19. The light-emitting diode as set forth in claim 12, wherein the length from the light-emitting facet to the facet opposite to said light-emitting facet is between 30 and 200 μm.

* * * * *